United States Patent
Maier et al.

(10) Patent No.: US 6,320,378 B1
(45) Date of Patent: Nov. 20, 2001

(54) CONTINUOUS MAGNETIC RESONANCE LINE-SCAN IMAGING IN THE PRESENCE OF MOTION AND VARYING MAGNETIC FIELD INHOMOGENEITIES WITHIN THE FIELD OF VIEW

(75) Inventors: Stephan E. Maier; Ferenc A. Jolesz, both of Brookline; Daniel F. Kacher, Allston, all of MA (US)

(73) Assignee: Brigham & Women's Hospital, Boston, MA (US)

( * ) Notice: Subject to any disclaimer, the term of this patent is extended or adjusted under 35 U.S.C. 154(b) by 0 days.

(21) Appl. No.: 09/822,646

(22) Filed: Mar. 30, 2001

Related U.S. Application Data

(60) Provisional application No. 60/193,617, filed on Mar. 31, 2000.

(51) Int. Cl.$^7$ .................................................. G01V 3/00
(52) U.S. Cl. ............................................ 324/307; 324/309
(58) Field of Search .................................... 324/306, 307, 324/309, 312, 318, 300, 313, 314; 382/173, 6, 284; 600/420

(56) References Cited

U.S. PATENT DOCUMENTS

| | | | |
|---|---|---|---|
| Re. 35,656 | * 11/1997 | Feinberg et al. | 324/309 |
| 4,767,991 | * 8/1988 | Rzedzian | 324/312 |
| 4,818,937 | * 4/1989 | Ailion et al. | 324/309 |
| 5,270,654 | * 12/1993 | Feinberg et al. | 324/309 |
| 5,786,692 | * 7/1998 | Maier et al. | 324/307 |
| 5,869,965 | * 2/1999 | Du et al. | 324/309 |
| 6,057,685 | * 5/2000 | Zhou | 324/306 |

OTHER PUBLICATIONS

Daniel F. Kacher, et al., "Motion Robust Imaging for Continuous Intraoperative MRI" Journal of Magnetic Resonance Imaging vol. 13 pp. 158–161 Apr. 2000.*

S. E Maier et al., "Robust Multi–Contrast Adaptive Imaging with Line Scan" Proceedings–International Society for Magnetic Resonance in Medicine, 8th; vol. 3 p. 1689 Apr. 2000.*

* cited by examiner

*Primary Examiner*—Jay Patidar
*Assistant Examiner*—Tiffany A. Fetzner
(74) *Attorney, Agent, or Firm*—Dike, Bronstein, Roberts & Cushman IP Group; George W. Neuner; David A. Tucker

(57) ABSTRACT

Apparatus and method for generating and displaying undistorted images of a field of view containing undesirable motion and/or time varying magnetic field inhomogeneities, uses a time series of magnetic resonance (MR) image signals, corresponding to a time series of MR images, generated by a single-shot imaging technique without shot-to-shot phase encoding. Signals are stored and analyzed to identify missing and/or deteriorated images (including image portions, image lines or image line segments). Identified missing and/or deteriorated images are compensated for by replacement, repair or otherwise. MR image signals representative of a specified time series are selected. Then, selected signals of corresponding portions of the field of view are averaged. The invention may be used to present: a continuously updated time series of images; a time series of images with only a specified portions of the image updated in each display; or an entire time series of images re-created in any desired sequence.

19 Claims, 8 Drawing Sheets

| Sweep | \ | 1 | 2 | 3 | 4 | 5 | 6 | 7 | 8 | 9 | 10 | 11 | 12 | 13 | 14 | 15 | 16 | | | | | T2W PDW |
|---|---|---|---|---|---|---|---|---|---|---|---|---|---|---|---|---|---|---|---|---|---|---|
| 1 | | A | A | A | A | A | A | A | A | A | A | A | A | A | A | A | A | | | | | |
| 2 | | | | | | | | | | | | | | | | | | | | | | |
| 3 | | | | | | | | | | | | | | | | | | | | | | |

| Sweep | 0 | 1 | 2 | 3 | 4 | 5 | 6 | 7 | 8 | 9 | 10 | 11 | 12 | 13 | 14 | 15 | 16 | 17 | 18 | 19 | 20 | T1W |
|---|---|---|---|---|---|---|---|---|---|---|---|---|---|---|---|---|---|---|---|---|---|---|
| 0 | A | S | | | | A | S | | | | A | S | | | | A | S | | | | | |
| 1 | | A | A | A | A | A | A | A | A | A | A | A | A | A | A | A | A | A | A | A | | |
| 2 | | | S | | | | S | | | | S | | | | S | | | S | | | | |
| 3 | | | A | A | A | A | A | A | A | A | A | A | A | A | A | A | A | A | A | A | A | |
| 4 | | | | | S | | | | S | | | | S | | | | S | | | | S | |
| 5 | | | | | A | | | | A | | | | A | | | | A | | | | A | |

| Sweep | \ | 1 | 2 | 3 | 4 | 5 | 6 | 7 | 8 | 9 | 10 | 11 | 12 | 13 | 14 | 15 | 16 | 17 | | | | DWI |
|---|---|---|---|---|---|---|---|---|---|---|---|---|---|---|---|---|---|---|---|---|---|---|
| 0 | | A | | | | | | C | C | C | C | C | C | C | C | C | C | C | | | | |
| 1 | | | C | | | A | A | B | B | B | B | A | A | C | C | C | C | | | | | |
| 2 | | | | A | | | | | | | | | | | | | | | | | | |
| 3 | | B | C | | B | B | B | B | B | B | B | B | B | B | B | B | B | | | | | |
| 4 | | | B | C | | | | | | | | | | | | | | | | | | |
| 5 | | | | B | C | | | A | A | A | A | A | A | C | C | A | A | | | | | |
| 6 | | | | | B | C | | | | | | | | | | | | | | | | |
| 7 | | | | | | B | C | | | | | | | | | | | | | | | |
| 8 | | | | | | | B | C | | | | | | | | | | | | | | |
| 9 | | A | | | | | A | C | C | A | A | C | C | B | C | C | C | | | | | |

Image Matrix (Column Direction)

A = Basic column excitation.
B = Column excitation with a first diffusion encoding gradient direction.
C = Column excitation with a second diffusion encoding gradient direction.
S = Optional saturation pulse.

Fig. 2b

```
Initialization:
FOR t = 0 TO t < NTIMES DO
    FOR y = 0 TO y < NLINES DO
        FOR x = 0 TO x < XRESOLUTION DO
            MISSINGPOINTSLIST(x,y,t) := FALSE
SLENGTH := XRESOLUTION
WHILE SLENGTH >= MINIMUMSLENGTH DO
    OFFSET := 0
    WHILE OFFSET < SLENGTH DO
        SPOS := OFFSET
        WHILE SPOS <= XRESOLUTION - SLENGTH DO Projection of Line Segments:
            FOR t = 0 TO t < NTIMES DO
                FOR y = 0 TO y < NLINES DO
                    SSUM(y,t) = 0
                    FOR x = SPOS TO x < SPOS + SLENGTH DO
                        SSUM(y,t) := SSUM(y,t) + IMAGEVALUE(x,y,t)

Test for Missing Line Segments:
            FOR l = 1 TO l <= MAXGAP DO

Comparison of Spatial Neighbours:
                FOR y = 1 TO y < NLINES-l DO
                    m := 0
                    WHILE   SSUM(y+m,t) < THRESHOLD × SSUM(y-1,t)   AND
                            SSUM(y+m,t) < THRESHOLD × SSUM(y+l,t)   AND
                            m < l                                           DO
                        m := m + 1
                    IF  m = l
                    THEN FOR m = 0 TO m < l DO
                            FOR x = SPOS TO x < SPOS + SLENGTH DO
                                MISSINGPOINTSLIST(x,y+m,t) := TRUE Comparison of Temporal Neighbours:
                FOR t = 1 TO t < NTIMES-l DO
                    m := 0
                    WHILE   SSUM(y,t+m) < THRESHOLD × SSUM(y,t-1)   AND
                            SSUM(y,t+m) < THRESHOLD × SSUM(y,t+l)   AND
                            m < l                                           DO
                        m := m + 1
                    IF  m = l
                    THEN FOR m = 0 TO m < l DO
                            FOR x = SPOS TO x < SPOS + SLENGTH DO
                                MISSINGPOINTSLIST(x,y,t+m) := TRUE Increment Segment Search Position:
            SPOS := SPOS + SLENGTH Increment Initial Offset:
        OFFSET := OFFSET + SLENGTH × OFFSETFRACTION Decrease Segment Length:
    SLENGTH := SLENGTH × SEGMENTFRACTION
```

Fig. 3

| | |
|---|---|
| NTIMES | Number of Repeat Measurements |
| NLINES | Number of Lines in one Image (also Resolution along $y$) |
| XRESOLUTION | Number of Points along $x$ |
| $t$ | Counter for Repeat Measurements |
| $y$ | Counter for Lines/Segments along $y$ |
| $x$ | Counter for Points along $x$ |
| MISSINGPOINTSLIST | Bit Array for Missing Points along $x$, $y$, and $t$ |
| SLENGTH | Segment Length Used to Search for Missing Segments |
| MINIMUMSLENGTH | Smallest Segment Length to be Used During Search |
| OFFSET | Offset of First Segment along $x$ |
| SPOS | Position of a Search Segment along $x$ |
| SSUM | Sum of Image Values along one Segment |
| IMAGEVALUE | Image Value Array for Points along $x$, $y$, and $t$ |
| MAXGAP* | Maximum Number of Missing Lines |
| $l$ | Current Gap Size Used in Search |
| $m$ | Gap Size Counter |
| THRESHOLD | Signal Fraction that Indicates a Missing Segment |
| OFFSETFRACTION | Fraction of Segment Length Used to Increment the Offset |
| SEGMENTFRACTION | Fraction of Segment Length Used to Decrease the Segment Length |

\* Preferably this value should be reduced as the segments become shorter and reach the value of 1 for the shortest segment (MINIMUMSLENGTH).

Fig. 4

CONTINUOUS MAGNETIC RESONANCE LINE-SCAN IMAGING IN THE PRESENCE OF MOTION AND VARYING MAGNETIC FIELD INHOMOGENEITIES WITHIN THE FIELD OF VIEW

This non-provisional application claims priority from U.S. Provisional Patent Application Ser. No. 60/193,617 filed Mar. 31, 2000.

BACKGROUND

1. Field of the Invention

The invention generally relates to magnetic resonance imaging techniques. More particularly, the invention relates to magnetic resonance imaging techniques useful in situations in which gross transient motion and/or magnetic field inhomogeneities are present within the field of view.

2. Summary of the Prior Art

Magnetic resonance imaging is the optimal imaging modality for surgical applications primarily because of its ability to elucidate a wide variety of lesions. Stereotactic systems employing magnetic resonance imaging steadily have been enhanced, thereby improving a surgeon's ability to safely and efficaciously operate. The latest step in this evolution has been the ability to provide intraoperative updates of previously obtained magnetic resonance images of tissues of interest in a manner that allows the surgeon to track changes therein throughout the course of a particular surgical procedure.

Unfortunately, the phase sensitivity of conventional two and three-dimensional Fourier transform magnetic resonance image scans to motion and varying magnetic field inhomogeneities causes problems. Specifically, it has been found that when there is motion within the imaging field of view during such conventional magnetic resonance imaging, undesirable artifacts are created in the resulting image. Similarly, varying magnetic field inhomogeneities in the imaging field of view also cause undesired artifacts in the resulting images. Accordingly, it presently is necessary to halt the surgical procedure, and to clear the surgical field of all metal operating instruments and the like, each time a conventional Fourier type magnetic resonance image is to be taken. Obviously, this is not a satisfactory requirement.

Besides multi-shot phase encoded, two-dimensional or three-dimensional Fourier imaging, the technique of so-called "line-scan imaging" also is known in the art. Generally speaking, line scan imaging sequentially acquires the individual lines of a magnetic resonance image in multiple independent single shots. Phase encoding is not used in line-scan imaging. Instead, only the magnitude of the Fourier-transformed signal is used. Known and established single-shot techniques, by their nature, do not have shot-to-shot phase encoding, although they generally have phase encoding within each shot. Therefore, a line-scan imaging sequence is immune to the phase encoding errors mentioned above that are encountered in conventional Fourier magnetic resonance imaging methods.

Typically, however, line-scan generated image signals demonstrate smaller signal-to-noise ratios than are present in conventional imaging techniques. This results in less distinct resultant images. In addition, line-scan imaging basically eliminates ghosting artifacts caused by gross transient motion-related shot-to-shot phase variations. Nevertheless, signal losses within each of the isolated lines still may occur due to non-uniform motion and/or magnetic field phenomena during the acquisition of the individual lines.

Accordingly, a technique for magnetic resonance imaging useful during the course of a surgical procedure or the like, without the requirement of a cessation of the procedure and/or a clearing of the field of view to be imaged, would be a significant advance in, and beneficial to, the art.

SUMMARY OF THE INVENTION

Therefore, it is an object of the present invention to provide an apparatus for, and method of, acquiring magnetic resonance images during the course of a surgical procedure or the like which does not require the procedure be stopped during the imaging process.

Also, it is an object of the invention to provide an apparatus for, and a method of, acquiring intra-operative magnetic resonance images in which there is no necessity to remove metallic surgical instruments or the like from the field of view during the imaging period.

Further, it is an object of the present invention to utilize basic averaging concepts in a novel way to overcome the shortcomings of line-scan magnetic resonance imaging during ongoing surgical procedures and the like.

Still further, it is an object of the present invention to provide an apparatus for, and method of, detecting, and correcting for, or supplying, images or image portions which are missing and/or deteriorated by isolated transient motion or displacement effects in line-scan magnetic resonance imaging.

Yet another object of the present invention is to provide an apparatus for, and method of, displaying a moving average of line-scan derived magnetic resonance images during the course of surgical procedures and the like.

These and other objects of the present invention are accomplished by the provision of an apparatus and a method that utilize line-scan techniques for creating magnetic resonance images of invasive surgical fields of view. This is accomplished without a requirement to either temporarily terminate the surgical procedure, or to clear the surgical site, as required in the prior art.

The invention proceeds from the concept that magnetic resonance images obtained using line-scan techniques are not dependent upon phase encoding. This results in magnetic resonance images that are immune to the phase errors induced in Fourier type magnetic resonance signals by gross transient field inhomogeneities such as those caused by the motion of metal surgical instruments in the magnetic field. It also results in images immune to gross transient motion induced phase errors.

Further, the present invention takes advantage of the fact that the signal-to-noise ratio of any magnetic resonance image is partially determined by the number of signals that are averaged in the course of the creation of each pixel of the final image. Commonly, this means that a significant number of signals are generated within a short time period, such that for all practical purposes the signals were all generated at the same time. The average value of the signals of each so generated group of signals then is used as the single "signal point" for the particular measurement involved. This technique has been found to be acceptable as a way of acquiring high signal-to-noise ratios for individual signals of an individual image.

The present invention expands upon this concept by the acquisition of magnetic resonance images using a line-scan technique at time intervals such that the various signals making up each image cannot be said to have been acquired essentially simultaneously. The advantages made possible by the implementation of this concept are significant. First, a display of the moving average of a time series of images so acquired is characterized by a signal-to-noise ratio determined by the number of images included in the average. Typically, this is significantly greater than the signal-to-noise ratio of each line-scan generated image.

Second, averaging images created from signals generated at spaced out intervals tends to minimize the effect of short-term transient gross displacements and varying magnetic field inhomogeneities within the field of view. Accordingly, distortions arising as a result of motion and/or field inhomogeneities in the field of view tend to be averaged out of an image representing an average of a significant number of images of the field of view taken at intervals over a given period of time.

Third, averaging as described herein permits the time history of displacement that occurs within the target object to be displayed as a single image. Further, any portion of that time history may be selected for use at any time. Therefore, comparisons of a target object may be made from different portions of a procedure, or to previously acquired images. Similarly, a running moving average of the target object may be continuously viewed during the course of the procedure, or thereafter. Still further, selected portions of the slice and/or volume scanned may be updated more frequently than other portions thereof. Similarly, such selected portions also may be provided at different resolutions and/or at different image contrasts. This allows a surgeon to focus upon certain target tissue and/or organs during the course of the surgical procedure, while at the same time simplifying and shortening the imaging scanning process.

The foregoing is an application of fairly basic averaging theory. The difficulty, however, is that common line-scan techniques used in magnetic resonance imaging are not totally dependable. Thus, it is well known that transient motion; displacement or other effects often have resulted in the deterioration and/or partial or complete loss of individual lines of an image. In such cases, the resulting deterioration of the average image is not easily averaged out. This is because an entire element is missing from the average, rather than one of its constituent elements being distorted. Further, it must be understood that the averaged images are created from groups of signals that are both space and time dependent. Accordingly, means must also be provided for searching out missing or damaged lines, or segments thereof, so that those lines or segments may be either replaced by interpolation or reacquisition, or factored out of the average image calculation.

In a preferred embodiment, therefore, the invention includes an apparatus for, and method of, acquiring a sequential time series of magnetic resonance image signals from an operative site or the like using a line-scan technique. Apparatus and method steps also are provided for receiving and processing the signals generated by the magnetic resonance imaging apparatus, and for displaying an undistorted, averaged magnetic resonance image of the field of interest.

BRIEF DESCRIPTION OF THE DRAWINGS

These and other objects and advantages of the present invention will become apparent to those skilled in the art in view of the following detailed description of a preferred embodiment of the invention rendered in conjunction with the appended drawings. In the appended drawings, like reference numerals refer to like elements throughout, and:

FIG. 2b is an illustrative table showing different contrast mechanisms (line acquisition schemes) for a hypothetical matrix size of 16 along the column direction y utilizing lines acquired as depicted in FIG. 2a;

FIG. 3 is a flow diagram of a missing/deteriorated line search sequence suitable for use in the present invention;

FIG. 4 is a table describing the various terms used in the flow diagram of FIG. 3;

DETAILED DESCRIPTION OF PREFERRED EMBODIMENT

Figure 1:
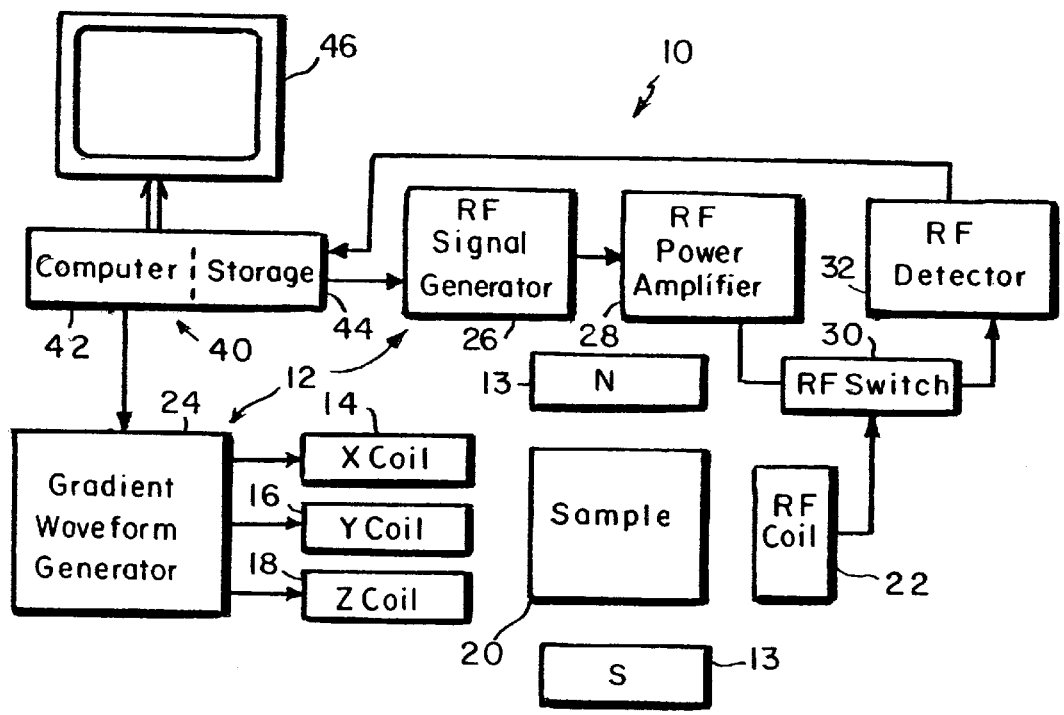
FIG. 1 is a high-level block diagram of an illustrative embodiment of a magnetic resonance imaging system suitable for use in the present invention.

Referring now to the drawings, and particularly to FIG. 1, and illustrative magnetic resonance imaging system 10 generally includes a magnet assembly, interface circuitry 12, and a computer 40. The magnet assembly includes a very strong magnet 13 that creates a homogenous magnetic field within and around a sample (e.g. an inert sample or patient). X, Y, and Z magnetic field gradient coils 14, 16 and 18 also form a part of the assembly and are positioned proximate to, or surrounding, the sample 20. The assembly further comprises one or more RF coils 22, which are positioned near, or around, the sample.

The interface circuitry 12 includes a gradient waveform generator 24 that has signal outputs connected to the gradient coils 14, 16 and 18, and a control input connected to the computer. An RF signal generator 26 also has a control input connected to the computer 40 and an output connected to an input of an RF power amplifier 28. The RF power amplifier has an output connected to an input of an RF switch 30. The RF switch is connected to the RF coil 22, and has an output connected to the input of an RF detector 32.

The computer 40 includes computing hardware 42 and storage 44, The computing hardware can comprise special purpose hard-wired computing circuitry dedicated to MR acquisition and imaging, a specially programmed general purpose computer, or a combination of both. The storage 44 can include various types of storage, such as disk storage and random access memory. The storage can be used to store data and programs, including the programs used to interact with the system's interface circuitry 12. The computer has a video output for providing video signals to display 46, as well as control outputs connected respectively to control inputs of the gradient waveform generator 24 and the RF signal generator 26. The computer also has acquisition input operatively connected to an output of the RF detector 32.

Figure 2A:
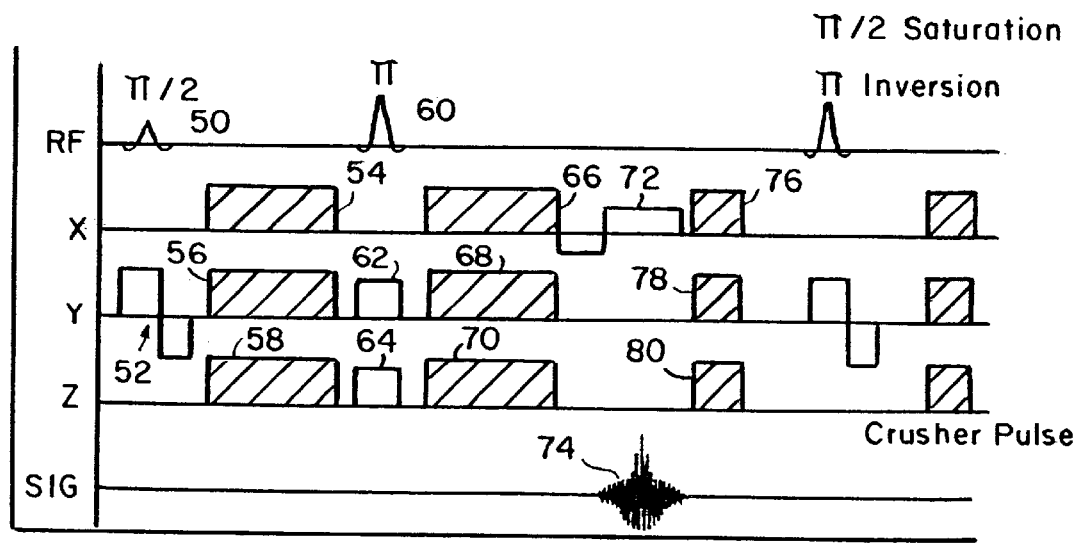
FIG. 2a is an image sequence diagram for the acquisition of one line of data from one column utilizing the apparatus generally illustrated in FIG. 1.

In operation, referring to FIGS. 1 and 2a, the imaging system 10 builds an image on a line-by-line basis under control of the computer 40 according to a line-scan imaging sequence. Those skilled in the art, of course, will realize that other single shot methods for acquiring multiple lines or complete images without shot-to-shot phase-encoding also could be used without departure from the invention in its broadest aspects. Known and established single-shot techniques, by their nature, do not have shot-to-shot phase encoding, although they generally leave phase-encoding within each shot. At the beginning of an acquisition sequence for a line, the computer 40 sends a signal to the RF signal generator 26, which responds by generating a π/2 pulse 50. This pulse is amplified by the RF power amplifier 28 and provided to the RF coil 22 via the RF switch 30. As this pulse is being provided, the computer instructs the gradient waveform generator 24 to drive the Y coil 16 with a slice selective bipolar pulse 52.

Next, the gradient waveform generator 24 provides a first set of crusher or diffusion encoding gradient pulses 54, 56, and 58 respectively to the X, Y, and Z gradient coils 14, 16 and 18. These gradient signals each include a single rectangular pulse, which is provided in order to crush the free induction decay (FID) signal, and if desired, to sensitize the MR imaging process to diffusion. After the falling edge of the gradient signals, a π pulse 60 is applied. At the same time, the gradient waveform generator provides a rectangular pulse on each of the Y and Z gradient coils (pulses 62, 64). Then, the waveform generator provides a second set of crusher or diffusion encoding gradient signals 66, 68 and 70 respectively to the X, Y and Z gradient coils 14, 16 and 18. These second crusher or diffusion encoding gradient signals are of the same amplitude and duration as the first crusher or diffusion encoding gradient signals. Once the second crusher or diffusion encoding gradient signals are turned off, the gradient waveform generator provides a readout pulse 72 on the X coil 14.

As a result of this excitation sequence, an echo 74 is received from the intersection of the planes defined by the πn/2 pulses. The RF coil receives this echo and provides it via the RF switch 30 to the RF detector 32. The computer 40 receives the output of the detector, and processes it to obtain one line to be displayed on the display 46. After the echo has been received, optional crusher gradient signals 76, 78, and 80 can be applied to the gradient coils 14, 16 and 18.

In the above regard, it also will be understood that the line-scanning scheme selected for processing is important. Basically, such schemes describe the sequence in which the various columns are excited. Thus, schemes for T2-weighted imaging are known from U.S. Pat. No. 4,818,937 (Ailion et al.), and for diffusion weighted imaging from U.S. Pat. No. 5,786,692 (Maier and Gudbjartsson). For convenience of reference, various schemes that can be used to enable the different contrast mechanisms for a hypothetical matrix size of 16 along the column direction y are depicted in the table of FIG. 2b.

Figure 2C:
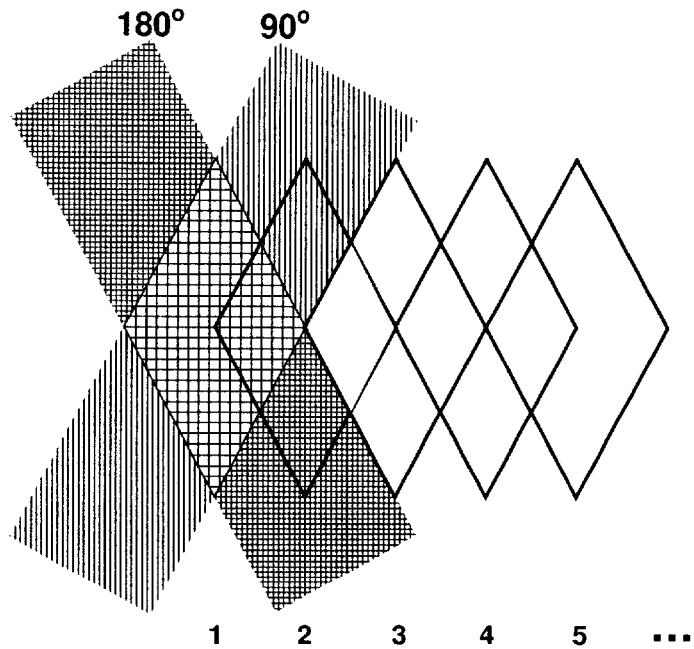
FIG. 2c shows a possible arrangement of column excitation for the generation of line-scan images.

An important consideration in the selection of a line-scanning scheme is the step size to be used in order to avoid cross talk from previously excited columns. For example, one possible arrangement of column excitation is shown in FIG. 2c. In this example, column cross-sections overlap, so that the position increment equals half the column width at the center of the column. Therefore, excitation of column number 1 followed by excitation of column number 2 causes cross talk in column number 2. This is because with the overlapping scan scheme part of column number 2 already was excited by the excitation of column number 1.

Further, due to imperfect excitation pulses with the gradual fall off of the excitation flip angle at the edges of the slices, some cross-talk can be expected for column number 3 as well. Thus, it has been found that column number 4 is the closest column that can be excited without expecting any cross talk from the excitation of column number 1.

Consequently, the present apparatus preferably repeats stepping with the above-mentioned distance across the field of view until further stepping would lead to excitation outside the image matrix. At this point, either the position counter is incremented by the step distance, and the matrix size along y is subtracted, or excitation is started at column number 2. This scan procedure has been found to yield the maximum effective repetition time. The reasons for this are that the step distance is minimal, and that the maximum possible time is used for a sweep before return to a column that overlaps with a previous excitation. Provided the effective repetition time is long enough, it is suitable for T2-weighed or proton-density-weighted imaging.

An example of this scan scheme is shown in FIG. 2b, in the row annotated as T2W/PDW. This scan scheme allows for extremely rapid T2-weighted and proton-density imaging, e.g., such images have been obtained in less than 10 seconds. This makes this scheme suitable for breath-hold imaging in the abdomen, which heretofore has been impractical due to scan times of five minutes or longer.

When the effective repetition time is reduced, i.e., the time between the excitation of neighboring columns with maximum overlap, T1-weighting results. This may be accomplished, for example, by increasing the step size so as to reduce the number of columns per sweep. The minimum number of columns per sweep is 1. Line scanning, unlike multi-slice phase-encoded scanning where subsequent slice excitations fully overlap, does not provide true T1-weighting, because the overlap between neighboring columns is not complete. This will be clear from FIG. 2c, wherein the four quarters of the column cross-section 2 have a different excitation history. One quarter was previously exposed to a 90° RF pulse, a second quarter was exposed to a 180° RF pulse, a third quarter was exposed to the combination of the 90° and 180° RF pulse, and the fourth quarter can be considered to be fully relaxed.

The deviation of the excitation profiles from a perfect rectangular profile complicates matters further. It has been found, however, that even if the weighting is not ideal, it is possible to obtain images that have contrast similar to truly T1-weighted, conventional phase-encoded spin-echo images.

Figure 2D:
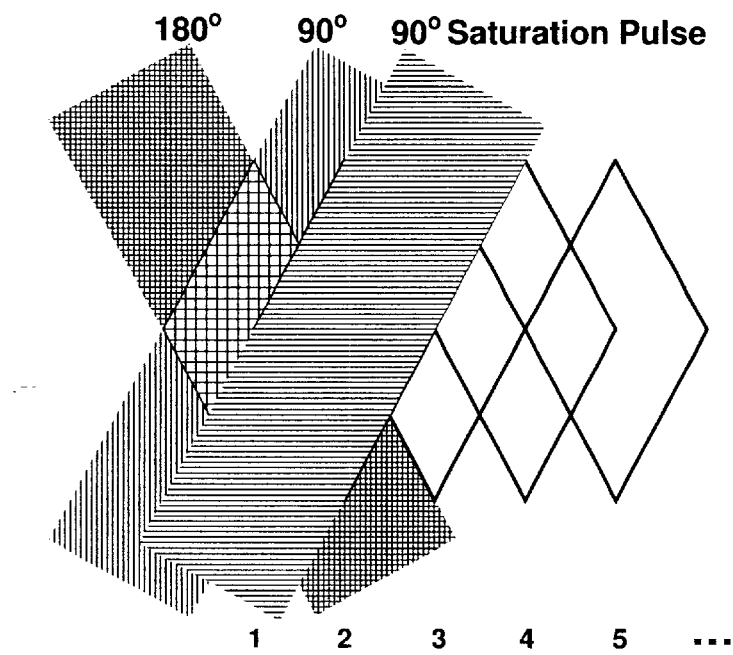
FIG. 2d shows a new arrangement of column excitation for the generation of line-scan images.

A novel approach is depicted in FIG. 2d. In particular, immediately following the column excitation, spins in the neighboring column arc saturated with a selective 90° RF pulse followed by crusher gradients. After the application of the saturation pulse, spins uniformly relax until column excitation returns to this position during the next sweep. This approach, however, is not limited to saturation. Hence, the preparation pulse can act as an inversion pulse provided that an 180° pulse is applied instead of a 90° pulse. This inversion pulse can be used to selectively suppress signals from tissues or fluids. (See, right hand portion of FIG. 2a)

Also, to ensure spin relaxation before pulse application, the neighboring column is not inverted. Instead, a column that will be excited within the current sweep is chosen to receive the inversion pulse. In other words, the column to be inverted is always spaced ahead of the column to be excited.

In addition, both T1-weighted imaging and the use of inversion pulses require the establishment of steady state conditions using a pre-sweep (sweep 0) without data collection. Moreover, the pre-sweep has to be performed for each repeat acquisition. Thus, the T1-weighted section (TW1) of the scan scheme table shown in FIG. 2b shows basic excitation (A) commencing at column 0 outside the image matrix, immediately followed by an optional saturation pulse (S) at column 1. (Sec, right hand portion of FIG. 2a) Moreover, to ensure constant T1-weighting, a constant number of excitations arc performed for every sweep during the entire scan, and after each sweep the column numbers to be excited are incremented by 1. Therefore, additional columns are excited outside the actual scan matrix.

The foregoing line-scan acquisition scheme can be modified to observe periodic motion, e.g., cardiac motion, by gating the acquisition of the first column of each sweep. Preferably, after each sweep the gating delay is incremented by the repetition time between columns divided by the step size. This ensures that the gating delay increases across the field of view in a continuous, instead of a stepwise, fashion.

Line-scan diffusion weighted imaging, on the other hand, requires yet another acquisition scheme. In U.S. Pat. No. 5,786,692, it was shown that a matrix with an odd number of columns is needed to permit continuous alternation between gradient direction and amplitude while sweeping through the scan matrix. It has been found, however, that only with a prime number of columns larger than the actual matrix size, can continuous alternation be achieved under all situations, Thus, for example, 33 columns (smallest odd number for a standard matrix size of 32) would not permit continuous scanning with three gradient directions, i,e., at some point during the scan a gradient direction must be utilized twice in order to avoid re-sampling of columns with the same gradient direction. This is not desirable, since it would affect the steady state of eddy-currents and of secondary echo cancellation. An example of this scheme using the basic excitation (A) along with the two other excitations (B) and (C), each having a different diffusion encoding gradient direction with a matrix size of 16 is provided in the table of FIG. 2b (section DWI). A pre-sweep is also performed in this scheme, but its purpose is not to ensure steady state of T1-weighting, but rather to ensure steady state eddy current effects. More than one pre-sweep may be beneficially performed in this alternative. It, however, is not necessary to perform the pre-sweep for repeat acquisitions or for images that are acquired subsequently.

As alluded to above, therefore, the apparatus and methods just described are used to create a sequential, time dependent series of image signals representative of an operative field or the like at different points in space and time. Conventional averaging theory suggests that this signal data, which is immune to adverse effects on phase encoding gradient signals used in conventional Fourier type imaging, can be averaged, and that the averaged data may be used to display a so-called "moving average" image of the region of interest. Further, since under this theory a significant number of signals would be used in the creation of each pixel of each such image, it is to be expected that the moving images so created would be characterized by a high signal-to-noise ratio.

Figure 5A:
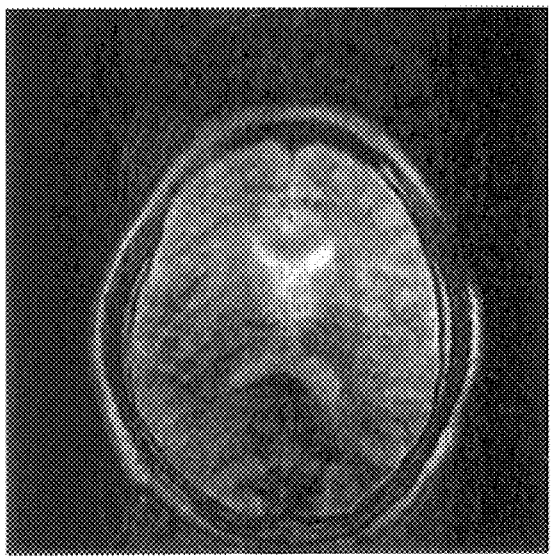
FIG. 5a shows a conventional T2-weighted spin-echo image that exhibits ghosting through the entire slice.
Figure 5B:
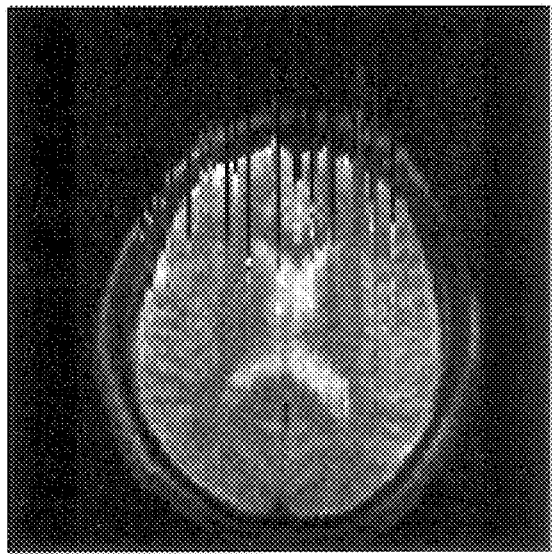
FIG. 5b shows a T2-weighted line-scan image which like FIG. 5a is corrupted only local to the source of the varying magnetic field inhomogeneity.
Figure 5C:
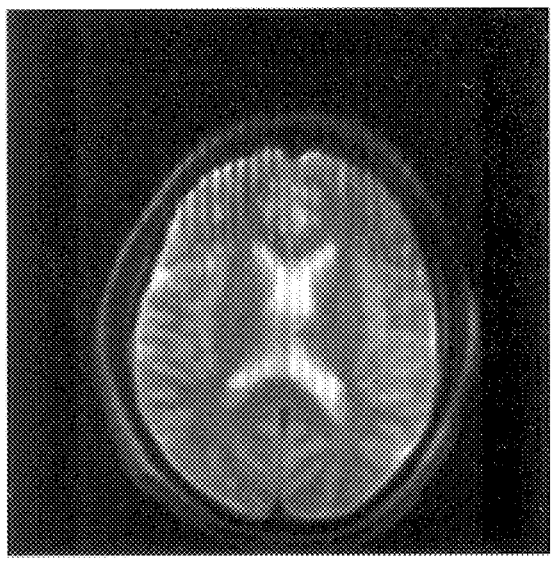
FIG. 5c shows an average of ten (10) T2-weighted line scan images like that shown in FIG. 5b.

Also as alluded to above, however, line-scan imaging techniques are subject to not only transient motion and/or displacement deterioration, but also to partial or entire line losses (see, FIG. 5b). It is not easy to compensate for such partial or entire line losses even by simple averaging. The loss of an entire line or line portion, on the other hand, leaves a gap in the image. Simple image averaging over time may tend to alleviate the effects of such gaps, but will not remove them entirely for the moving average images created (see, FIG. 5c). Therefore, all missing lines and/or line portions in the data representative of the images to be averaged to create the desired moving average image must be found. This allows them to be excluded from the average, replaced by reacquisition or interpolation (see, FIG. 5d), or otherwise compensated for in the average image determination.

To accomplish this, the processing apparatus searches the acquired line scan signal data for missing lines and/or line segments. Then, it replaces missing lines or line segments with lines or line segments that are either interpolated from neighboring signals in space and time, or that are reacquired by the imaging apparatus, if possible. Alternatively, the processing apparatus may remove the image containing the gaps from the database. Finally, the processing apparatus calculates and displays the desired moving average image of the region of interest utilizing the corrected database.

A better understanding of the preferred operation of the processing apparatus in the context of the method and apparatus of the present invention will become apparent by reference to the flow diagram shown in FIG. 3 in conjunction with the table shown in FIG. 4.

First, the processing apparatus is initialized. This initialization includes the count of repeat measurements being set to 0, and subsequently incremented up to but not including the number of repeat measurements to be made. Further, the count of lines is set to 0, and subsequently incremented up to but not including the total number of lines along the y-axis. Still further, the count of points is set to 0, and subsequently incremented up to but not including the total number of points along the x-axis. At this point in the signal processing, the bit array of missing points is set to 0 for all x, y, and t points. Then, the segment length used to search for missing segments is initialized to be equal to the number of points along the x-axis.

Next, it is determined whether or not the segment length used to search for missing segments is greater than or equal to the smallest segment length to be used during the search. If this is the case, the offset of the first segment along the x-axis is initialized to 0. At this point, the processing continues. However, prior to the process re-entering the previously mentioned comparison of segment length with minimum segment length, the segment length is decremented by a fraction of the segment length.

Next, it is determined whether or not the offset used to start the search for missing line segments is less than the current segment length. If the offset of the first segment along the x-axis is less than the segment length used to search for missing segments, the position of the search segment along the x-axis is initialized to the offset. At this point, the processing again continues. However, prior to the process re-entering the above-mentioned comparison between offset and segment length, the initial offset is incremented by a fraction of the segment length.

Next, it is determined whether or not the position of the search segment along the x-axis is equal to or less than the total number of points along the x-axis minus the segment length being used to search for missing segments. At this point, processing again continues. However, prior to re-entering the above-mentioned comparison of the search segment position along the x-axis with the total number of points along the x-axis minus the segment length being used to search for missing segments, the segment search position is incremented by the segment length.

If the position of the search segment along the x-axis is equal to or less than the total number of points along the x-axis minus the segment length being used to search for missing segments, the processing apparatus proceeds with a projection of line segments. Thus, part of the process is a test for missing line segments in space and time followed by incremental increase in the position of the search segment along the x-axis, incremental increase of the initial offset of the first segment, and decrement of the search segment length.

Effectively, therefore, the processing apparatus creates smaller and smaller vertical fractions of the field of view at different positions with different offsets within which to conduct its search for missing line segments (portions).

The search for missing line segments includes the following steps: (1) a projection of line segments; and (2) a test for missing line segments. Further, the test for missing line segments includes: (1) a comparison of spatial neighbors, and (2) a comparison of temporal neighbors.

Starting from the point at which the search segment along the x-axis is equal to or less than the total number of points along the x-axis minus the segment length used to search for missing segments, the algorithm is repeated NTIMES, and the dependent algorithm is repeated according to the number of measurements taken along the y-axis (NLINES). Next, the sum of the image values along the (y, t) segment is initialized to 0. Then, using all of the position values (x) between the position of the search segment along the x-axis and the position of the search segment along the x-axis plus the segment length being used to search for missing segments, the image values along the segment (x, y, t) are added to the sum of the image values along the (y, t) segment.

Summarily stated, the image portion under consideration is projected along the segment direction (x) as a single summation profile.

Then, the gap size (1) being used in the search is initialized to 1, and subsequently incremented to the maximum possible number of missing lines that lie adjacent to each other. In practice, the maximum number of missing adjacent lines becomes smaller as the lengths of the segments under analysis become shorter to the point that its value is 1 for the shortest segment.

Thereafter, separate, but similar, comparisons are made of spatial and temporal neighbors. Thus, for the spatial case, y is initialized to 1, and subsequently incremented up to but not including the total number of lines minus the gap size. Thereafter, the gap size counter (m) is initialized to 0. The sum of the image values along the (y+m, t) segment is then checked to determine if it is less than the signal fraction that indicates a missing section multiplied by the sum of the image values of the segments adjacent to the gap, respectively. As long as this is the case, the gap size counter (m) is repeatedly incremented by 1 in a DO loop.

When the gap size counter (m) is determined to be equal to the gap size (1) currently being used in the search, all segments within the gap are determined to be missing.

In the final step, the points belonging to the bit array for missing points is filled out at the points within the segments determined to be missing.

Temporal neighbors are compared in a similar manner to that used for spatial neighbors. In short, this means that single, double or more points along the established profile that have signal amplitudes below a predetermined fraction of the expected signal amplitude as defined by the nearest two points in space and time are identified as points that represent a line with missing data. This process is continued with smaller and smaller increments of the overall segment length until a minimum line segment length is reached. In practice, it has been found that a minimum segment length on the order of about 16 points is satisfactory.

It also has been found that reducing the value of the maximum number of missing lines as the processing apparatus works with smaller and smaller segment lengths, the maximum number of lines should skip from three, to two, and finally to one. The reason for this is to avoid interpreting actual features of the image as missing lines.

In addition, an attempt may be made to eliminate segments falsely categorized as being missing. Hence, it will be understood that with repeat measurements, features of the image that are falsely categorized as missing segments will be similarly categorized for all, or at least the majority, of the repeat measurements. Truly missing segments, on the other hand, are, depending upon the number of repeat measurements, lost only once or at most a few times. In this regard, the probability of a segment of MINIMUMSLENGTH being missing k times at a particular position follows a hyper-geometric distribution that may be representatively shown as:

$$P(k) = \frac{\binom{r}{k}\binom{m-r}{n-k}}{\binom{m}{n}}$$

where r is the number of repeat measurements (NTIMES), m is the maximum number of missing segments (NTIMES×NLINES×XRESOLUTION/MINIMUMSLENGTH), and n is the number of segments actually missing in an acquisition.

The binomial coefficients in the above relationship may become huge and thus difficult to manipulate. Fortunately, however, in the present situation, it may be assumed that for n/m<0.1 and m>60, the hyper-geometric distribution can be approximated by the following binomial distribution that is much more easily calculated:

$$P(k) = \binom{n}{k} p^k q^{(n-k)}, \; p = r/m, \; q = 1 - p$$

In addition, to make the elimination process more sensitive, the area of no signal, e.g., air surrounding the object to be scanned, may be considered to have no lines missing. This results in the maximum number of missing line segments m being computed as the total number of acquired voxels above a specified threshold divided by MINIMUMSLENGTH.

In a first pass, therefore, the elimination algorithm calculates the probability P(k). More particularly, starting from k=0, k is incremented until the function P(k) becomes smaller than the predetermined threshold, typically about $1.0 \times 10^{-3}$ (or even $1.0 \times 10^{-4}$ if artifacts are abundant and only a few repeat measurements are taken). In any event, once the threshold is reached, all segments found to be missing k or more times are considered to be image features and are eliminated from the list of missing segments.

At this point, the number of actually missing segments n is recalculated, and assuming that some preselected minimum number of previously missing segments have been eliminated, a second pass of the elimination algorithm may be performed. Accordingly, it will be seen that since the number of possible missing segments is decreased during each pass, the probability threshold can be increased with each pass, for example, by a factor of three (3) followed by a threshold of about $1.0 \times 10^{-2}$. At the latter level, the probability is only about 1 in 100 that k segments will be missing at a particular position. Accordingly, the determination of truly missing segments can be improved, and this improvement will itself improve the more repeat measurements that are available for processing.

As noted, the result of this processing is a bit map of missing points from the database originally discussed. These points may be interpolated from their nearest neighbors so as to avoid unacceptable artifacts in the completed image.

The foregoing principles may be further illustrated by the following examples.

EXAMPLE I

In this case, surgery was performed in a vertical gap open-configuration 0.5T Signa SP scanner (General Electric Medical Systems, Milwaukee, Wis.). Spin-echo line-scan images with T1 and T2 weighting were acquired throughout the course of surgery. The prescans for both weightings were performed prior to surgical opening, during cessation of activity, to ensure an accurate $\pi$ refocusing RF pulse.

The signal-to-noise ratio of a magnetic resonance image is partially determined by the number of signal averages as mentioned previously. Further, display of a moving average of a time series of images increases the signal to noise ratio and minimizes the effect of short term displacement and varying magnetic field inhomogeneities within the field of view. Averaging, moreover, permits the time history of displacement that occurs within the object to be displayed as a single image.

Further, also as noted above, if individual lines have been totally deteriorated by motion and/or displacement, they in some cases may be averaged out by subsequent acquisitions.

Figure 5D:
FIG. 5d shows that interpolation between lines can correct the effect shown in FIGS. 5b and 5c.

The effects of motion of surgical instruments (a titanium curette and titanium forceps) in the field of view are shown in the images depicted in the drawings. Specifically, the conventional spin echo-image (FIG. 5a) exhibits ghosting through the entire slice, whereas the line scan image (FIG. 5b) and the averaged line scan image (FIG. 5c) are corrupted only local to the source of the varying magnetic field inhomogeneity. Interpolation between lines can correct this effect (FIG. 5d).

Figure 6A:
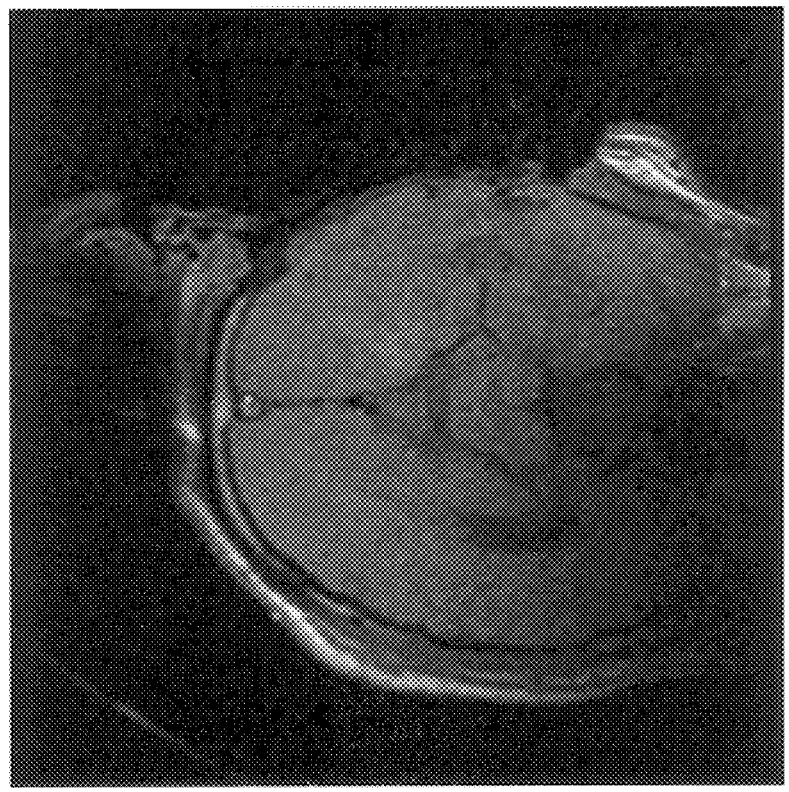
FIG. 6a shows a conventional T1-weighted spin-echo image acquired during an interval in surgery wherein the surgeon ceased all activity.
Figure 6B:
FIG. 6b is a line-scan image acquired subsequent to that shown in FIG. 6a while the surgeon was using titanium tools and suction to resect a lesion.

FIG. 6a shows a T1-weighted spin-echo image acquired during surgery. The surgeon ceased all activity during this acquisition. A line-scan image was subsequently acquired (FIG. 6b) while the surgeon was using titanium tools and suction to resect a lesion. It is to be noted that the latter image exhibits no artifact from motion or from field inhomogeneity. Hence, although 2D Fourier transform imaging inherently displays a better signal to noise ratio than 1D line scan imaging, the signal to noise ratio of the latter technique may be improved by averaging.

EXAMPLE II

Figure 7A:
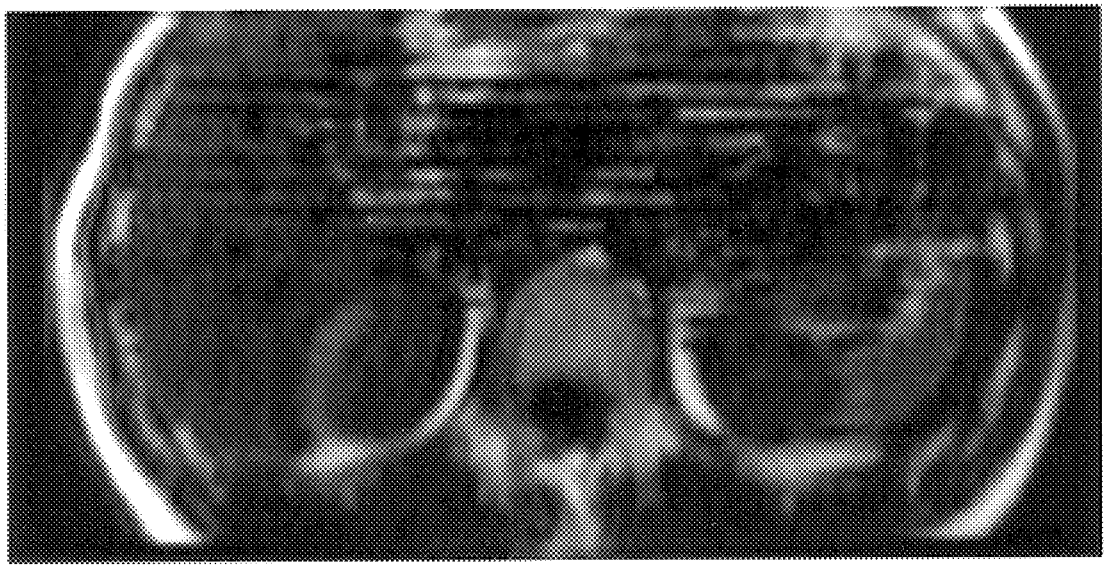
FIG. 7a shows an abdominal diffusion weighted image obtained using a breathold line-scan diffusion imaging technique in a normal volunteer; and, FIG. 7b shows an image similar to that of FIG. 7a wherein missing and/or deteriorated lines have been corrected in accordance with this invention.
Figure 7B:
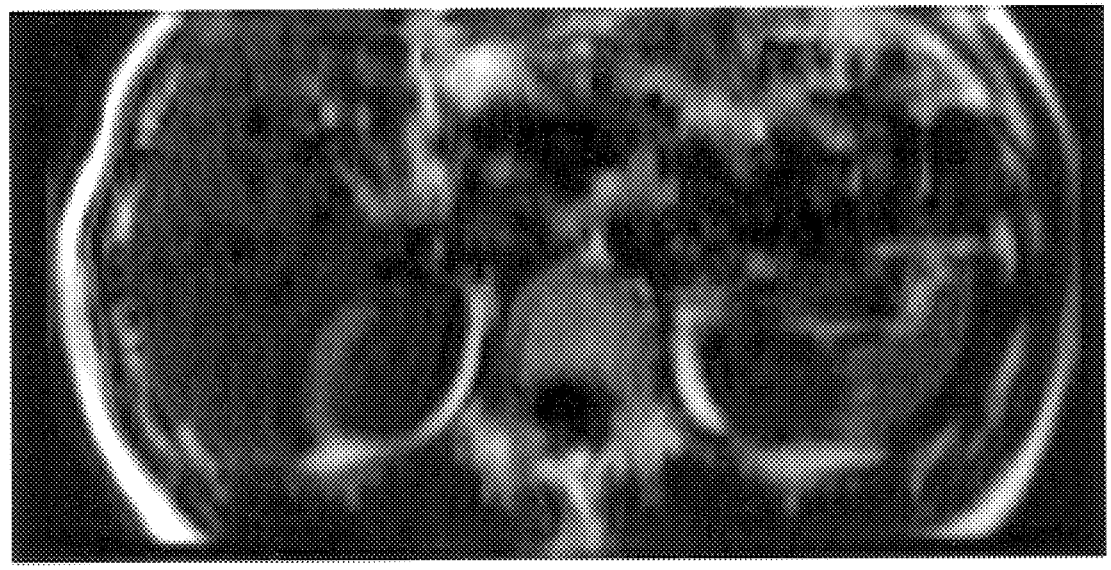

In this case, abdominal diffusion weighted (b=750 sec/mm$^2$) images were obtained using a breathold line scan diffusion imaging technique in a normal volunteer. The other scan parameters utilized were: slice thickness 8 mm, field of view 320 mm, matrix size 128×64, spline interpolated to 256×128, and scan time 11 seconds. The resultant data without correction is shown in FIG. 7a. Signal loss in areas of cardiac related motion is clearly visible. FIG. 7b, on the other hand, shows the image after correction as discussed above.

Having now described a preferred embodiment of the present invention in detail, and having provided several examples supporting this detailed description, it will be understood that numerous changes, variations, modifications, alterations and the like will occur to those skilled in the art. It accordingly is to be understood that this specification has been presented by way of illustration only, and not as limiting of the invention. The scope of the invention is intended to be limited only by the terms of the appended claims.

What is claimed is:

1. A method for identifying and replacing missing or deteriorated images, image portions, image lines and/or segments of image lines in a database of signals representative of a time sequenced series of magnetic resonance images of a selected field of view obtained by a single-shot line-scan imaging technique and/or another single-shot imaging technique without shot-to-shot phase encoding, wherein each said image includes a plurality of mutually parallel lines, said method comprising the steps of:

sequentially incrementally dividing each image of said field of view into smaller and smaller fractional portions until a preselected minimum portion size is reached;

projecting each said portion of each said image along a read direction so as to form an associated summation profile;

identifying points along each said associated summation profile having signal amplitudes that are less than a preselected threshold percentage of the signal amplitude of the nearest neighboring points in space and time thereto in said profile;

forming a bit map of the image, image portion, image line and/or segments of image lines represented by said identified points; and interpolating replacement images, image portions, image lines and/or segments of image lines for said identified images, image portions, image lines and/or segments of image lines using said nearest neighbor images, image portions, image lines and/or segments of image lines.

2. Apparatus for creating substantially undistorted magnet resonance images of a field of view containing extraneous, time-varying magnetic field inhomogeneitics and/or motion, said apparatus comprising:

magnetic resonance means for generating image signals that together are representative of a time series of images of a predefined field of view using a single-shot line-scan imaging technique or another single-shot imaging technique without shot-to-shot phase encoding, said apparatus comprising:

analysis means for analyzing said image signals so as to identify missing and/or deteriorated images, image portions image lines and/or segments of image lines in each of said time series of images of said field of view, which compares spatial and temporal neighbors;

processing means for replacing and/or repairing the so identified missing and/or deteriorated images, image portions image lines and/or segments of image lines in each of said time series of images of said field of view, which compare spatial and temporal neighbors;

selection means for selecting from among said image signals those image signals representative of a specified time series of said magnetic resonance images;

calculation means for averaging those of said selected signals representative of corresponding portions of said field of view, which compare spatial and temporal neighbors; and means for displaying said averaged signals in the form of a single image.

3. An apparatus according to claim 2, wherein said magnetic resonance means comprise a magnetic resonance imaging apparatus adapted for the generation of image signals from a surgical operative site during the course of an ongoing surgical procedure.

4. An apparatus according to claim 2, wherein said selection means is adapted to sequentially select overlapping groups of said image signals representative of different time series magnetic resonance images of said field of view, and wherein said apparatus is adapted to display a moving time average of said groups comprising a sequential display of the averages of each of said group of the time series of images.

5. An apparatus according to claim 2, wherein said analyzing means comprises a memory means for containing image signal information generated by said magnetic resonance imaging means, and search means for locating missing and/or deteriorated images, image portions, image lines and/or segments of image lines in space and time within the image signal information stored in said memory.

6. An apparatus according to claim 5, wherein said search means comprises a preprogrammed central processor including means for establishing a missing image, image portion, image line and/or segment of an image line being searched for, means for successively dividing the image signals representing each of the images, image portions, image lines and/or segments of image lines making up each of the time sequence images into successively smaller portions; means for comparing each image signal of each portion of each image with the image signals adjacent thereto in both space and time such that if the image signal so compared has an intensity level smaller than a predetermined threshold percentage of the intensity level of any neighboring image signal that image signal is deemed to be missing and/or deteriorated, and means for determining whether or not the adjacent number of so determined missing and/or deteriorated image signals correspond to the size of the missing image, portion, image line and/or segment of an image line being searched for, and output means for identifying missing images, image portions, image lines and/or segments of image lines so identified in each successive division of each of said time sequence of images.

7. An apparatus according to claim 2, wherein said magnetic signal generating means further comprises control means for selectively determining the portion of the field of view from which magnetic resonance image signals are generated at any given point in time.

8. A method for acquiring substantially undistorted images from a field of view containing time-varying magnetic field inhomogeneities and/or motion, said method comprising the steps of:

generating a plurality of magnetic resonance signals representative of a time series of magnetic resonance images from the field of view using a single-shot line-scan imaging technique or another single-shot imaging technique without shot-to-shot phase encoding;

storing the magnetic resonance signals so generated;

analyzing said image signals so as to identify missing and/or deteriorated images, image portions, image lines and/or segments of image lines in each of said time series of images of said field of view, by comparing spatial and temporal neighbors;

replacing and/or repairing the so identified missing and/or deteriorated images, image portions, image lines and/or segments of image lines in each of said time series of images of said field of view, by comparing spatial and temporal neighbors;

selecting from among said image signals those image signals representative of a specified time series of said magnetic resonance images;

averaging those of said selected signals representative of corresponding portions of said field of view; and displaying said averaged signals in the form of a single image.

9. The method according to claim 8, wherein said analyzing step includes repeatedly incrementally calculating the probability $P(k)$ that an image, image portion, image line and/or segment of an image line is missing k times, wherein $P(k)$ is calculated starting from $k=0$, until $P(k)$ becomes smaller than a predetermined threshold, and thereafter eliminating images, image portions, image lines and/or segments of image lines identified as being missing all images, image portions, image lines and/or segments of image lines found to be missing k or more times in said calculations.

10. The method according to claim 8, wherein said analyzing step further includes selectively adjusting the resolution, contrast and/or rate of update of predetermined portions of the field of view, and said selecting step further includes selecting those predetermined sections of the field of view for further processing and display with or without the remainder of the averaged image.

11. The method according to claim 8, wherein the single-shot imaging technique is a line-scan imaging technique including repeated stepping (column excitation) at a distance of three (3) columns across the field of view until further stepping would lead to excitation outside the image matrix and thereafter incrementing the position counter by the step distance subtracted from the matrix size along y, or restarting the column excitation sequence with the column adjacent to the column from which the next preceding sweep was started.

12. The method according to claim 11, further wherein following each column excitation the spins of the neighboring column are saturated with a selective 90° pulse followed by the application of crusher gradients.

13. The method according to claim 11, wherein a constant number of excitations are performed for each sweep during the entire scan, and wherein after each sweep the column numbers to be excited are incremented by one (1).

14. The method according to claim 11, further wherein following each column excitation the spins of another of the columns column are inverted with a selective 180° pulse permissibly followed by the application of crusher gradients.

15. The method according to claim 11, further wherein following each column excitation the spins of another of the columns column are flipped using a preselected flip angle pulse permissibly followed by the application of crusher gradients.

16. The method according to claim 8, wherein the number of columns is selected to be a prime number greater than that of the matrix size to be used in the image processing.

17. The method according to claim 11, wherein the acquisition of the first column of each sweep is gated, and wherein after each sweep the gating delay is incremented by the repetition time between columns divided by the step size.

18. An apparatus for identifying and replacing missing images, image portions image lines and/or segments of image lines in a database of signals representative of a time sequenced series of magnetic resonance images of a selected field of view obtained by a single-shot line-scan imaging technique or another single-shot imaging technique without shot-to-shot phase encoding, wherein each said image includes a plurality of mutually parallel lines, said apparatus comprising:

division means for sequentially incrementally dividing each image of said field of view into smaller and smaller fractional portions until a preselected minimum portion size is reached;

projecting means for projecting each said portion of each said image along a read direction so as to form an associated summation profile;

identification means for identifying points along each said associated summation profile having signal amplitudes that are less than a preselected threshold percentage of the signal amplitude of the nearest neighboring points in space and time thereto in said profile;

forming means for forming a bit map of said images, image portions, image lines and/or segments of image lines represented by said identified points; and interpolation means for interpolating replacement images, image portions, image lines and/or segments of image lines for said identified images, image portions, image lines and/or segments of image lines using said nearest neighbor images, image portions, image lines and/or segments of image lines.

19. The method of claim 8, wherein said selecting step further includes the sequential selection of overlapping groups of said image signals representative of different time series magnetic resonance images of said field of view, and said displaying step further includes the display of a moving average of said groups comprising a sequential display of the average of each of said time series group images.

* * * * *